(12) United States Patent
Shiga et al.

(10) Patent No.: US 6,476,418 B1
(45) Date of Patent: *Nov. 5, 2002

(54) THIN FILM TRANSISTOR FOR LIQUID CRYSTAL DISPLAY

(75) Inventors: Shunsuke Shiga, Tokyo (JP); Osamu Sukegawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/108,093

(22) Filed: Jun. 30, 1998

(30) Foreign Application Priority Data

Jun. 30, 1997 (JP) .............................. 9-173661

(51) Int. Cl.⁷ .............................. H01L 29/786
(52) U.S. Cl. ............................. 257/72; 257/59
(58) Field of Search .................. 257/59, 72

(56) References Cited

U.S. PATENT DOCUMENTS

| | | | | |
|---|---|---|---|---|
| 4,990,981 A | * | 2/1991 | Tanaka | 257/59 |
| 5,416,340 A | * | 5/1995 | Yoshida | 257/59 |
| 5,614,731 A | * | 3/1997 | Uchikoga | 257/59 |
| 5,811,846 A | * | 9/1998 | Miura | 257/59 |
| 5,981,973 A | * | 11/1999 | Matsuzaki | 257/72 |

FOREIGN PATENT DOCUMENTS

| | | |
|---|---|---|
| JP | 1-133124 | 11/1989 |
| JP | 7-94753 | 4/1995 |
| JP | 7-114046 | 5/1995 |
| JP | 7-147411 | 6/1995 |
| JP | 7-326763 | 12/1995 |
| JP | 8-32073 | 2/1996 |

OTHER PUBLICATIONS

Atsushi Sugahara, et al., *Low Photo–I, cakage–Current Structure for a–Si TFT–I, CDs*, "Material and Device Research Lab., R&D Center, Toshiba Corp.", AMLCD '94, pp. 184–187.

* cited by examiner

Primary Examiner—Jerome Jackson
(74) Attorney, Agent, or Firm—Scully, Scott, Murphy & Presser

(57) ABSTRACT

In a TFT (Thin Film Transistor) of the present invention applicable to an LCD (Liquid Crystal Display) includes a gate electrode, a gate insulation film, an island-like semiconductor layer, a drain electrode and a source electrode sequentially laminated on a transparent insulative substrate. A part of the semiconductor layer above the gate electrode in the direction of channel length has a smaller dimension than the other part in the direction of channel width. With this configuration, the TFT reduces a light OFF current while preventing a light ON current from being reduced.

18 Claims, 5 Drawing Sheets

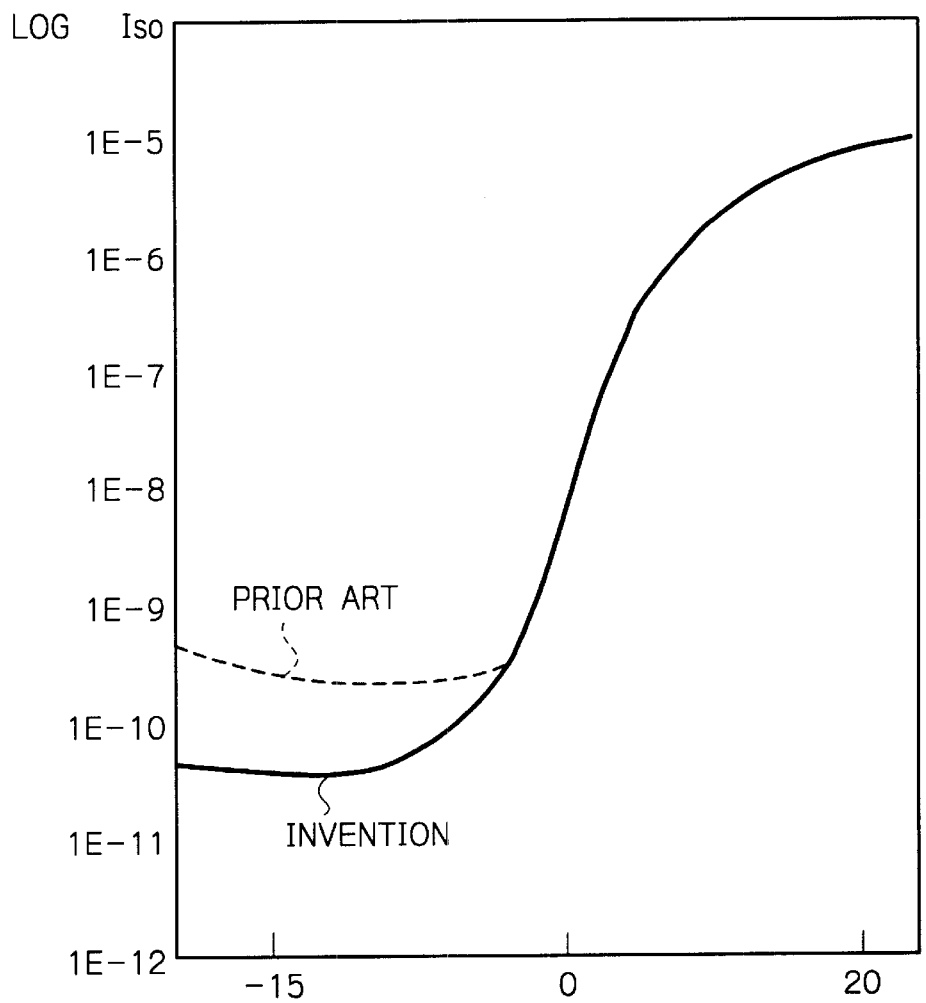

120
THIN FILM TRANSISTOR FOR LIQUID CRYSTAL DISPLAY

BACKGROUND OF THE INVENTION

The present invention relates to a liquid crystal display (LCD) and, more particularly, to a thin film transistor (TFT) for controlling current supply to a pixel electrode.

While TFTs are extensively used in the drive circuits of various kinds of devices as switching elements, the application of TFTs to LCDs is conspicuous. However, a TFT for use in an LCD has the following problem. Assume that a semiconductor layer included in the TFT is implemented by amorphous silicon (a-Si:H) often applied to, e.g., LCDs. Then, a photocarrier is generated in the a-Si:H layer by light output from a backlight which is a light source for display. The photocarrier migrates in regions where electric field control by a gate electrode and a drain electrode and a source electrode is weak, enhancing a light OFF current. As a result, leak occurs via a pixel electrode and degrades display quality. It is a common practice to reduce light incident to a TFT by a shield layer provided on a substrate facing a glass substrate or on the glass substrate. The shield layer, however, is not fully satisfactory because when the backlight is intense, light enters the TFT due to reflection and diffusion. This problem is particularly serious with, e.g., a monitor LCD or an on-board LCD needing a high luminance backlight.

As for the light OFF current, Japanese Patent Laid-Open Publication No. 7-147411 proposes to locally reduce the area of a low concentration diffusion layer included in a semiconductor device, thereby reducing the photocarrier. Japanese Patent Laid-Open Publication No. 7-94753 discloses a structure including a gate electrode which is provided with a greater area than a semiconductor layer so as to screen the entire semiconductor layer.

The technology taught in the above Laid-Open Publication No. 7-147411 has a problem that it reduces even the effective width of the channel of the TFT and therefore the ON current. Such a technology is not feasible for a TFT using a-Si:H, among others. Laid-Open Publication No. 7-94753 mentioned above also reduces the ON current because the contact portions between the source electrode and drain electrode and the semiconductor layer are screened; particularly, resistance increases at the contact portions when use is made of a-Si:H.

Technologies relating to the present invention are also disclosed in AMLCD '94 and Japanese Patent Laid-Open Publication Nos. 7-114046, 7-326763, and 8-32073.

SUMMARY OF THE INVENTION

It is therefore an object of the present invention to provide a TFT capable of reducing a light OFF current while preventing a light ON current from being reduced.

In accordance with the present invention, in a TFT for an LCD and having a gate electrode, a gate insulation film, an island-like semiconductor layer, a drain electrode and a source electrode sequentially laminated on a transparent insulative substrate, a part of the semiconductor layer above the gate electrode in the direction of channel length has a smaller dimension than the other part in the direction of channel width.

BRIEF DESCRIPTION OF THE DRAWINGS

The above and other objects, features and advantages of the present invention will become apparent from the following detailed description taken with the accompanying drawings in which:

FIG. 5 is a graph comparing the present invention and prior art with respect to a relation between a gate voltage and a source-drain voltage;

DESCRIPTION OF THE PREFERRED EMBODIMENTS

Figure 1A:
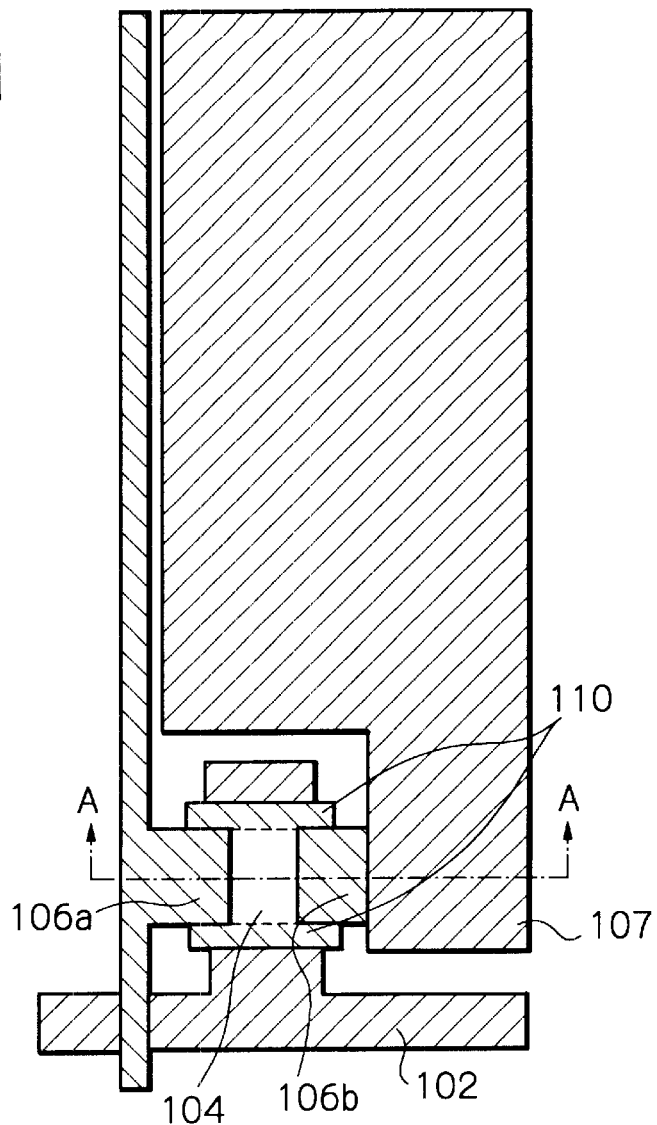
FIG. 1A is a plan view showing a conventional TFT.
Figure 1B:
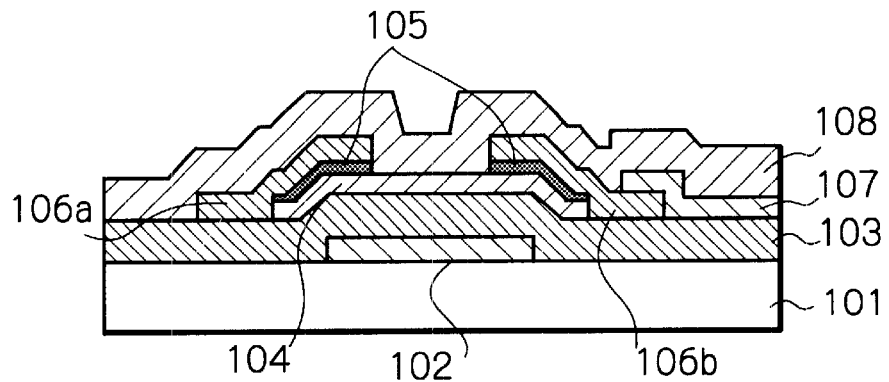
FIG. 1B is a section along line A—A of FIG. 1.

To better understand the present invention, brief reference will be made to a conventional TFT for use in an active matrix type LCD, shown in FIGS. 1A and 1B. As shown, the TFT includes a glass substrate 101. A gate electrode 102 and a first insulation film or gate insulation film 103 are sequentially formed on the glass substrate 101. A semiconductor layer 104 is formed on the insulation film 103 just above the gate electrode 102. Two $n^+$ type semiconductor layers 105 are provided at both sides of the semiconductor layer 104. A drain electrode 106a and a source electrode 106b are respectively formed on the opposite $n^+$ type semiconductor layers 105. The source electrode 106b is formed integrally with a pixel electrode 107. A second insulation film 108 covers the entire TFT laminate, as illustrated.

Figure 2A:
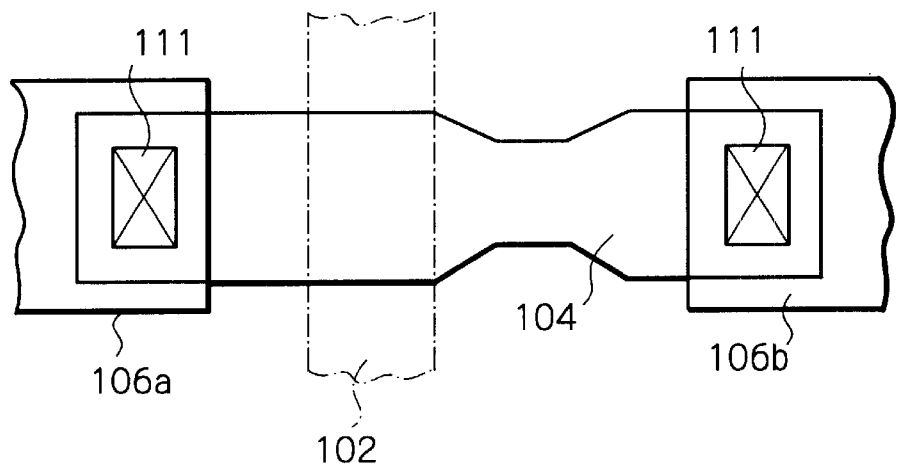
FIGS. 2A and 2B are plan views showing another conventional TFT.
Figure 2B:
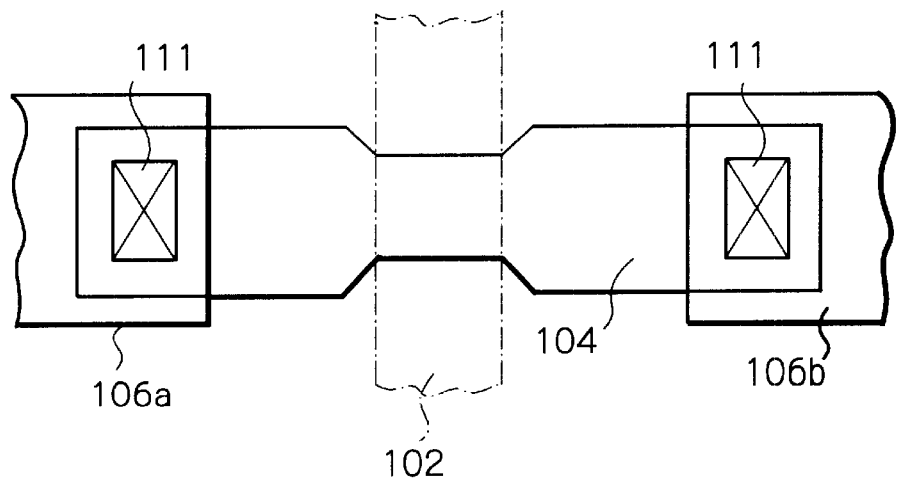
Figure 3:
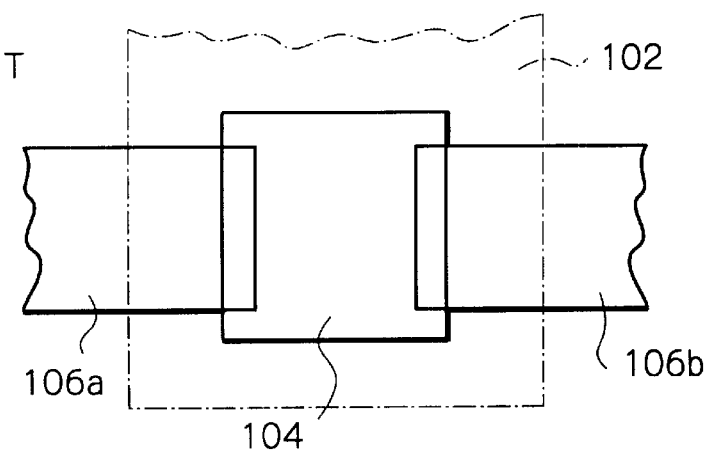
FIG. 3 is a plan view showing still another conventional TFT.

Assume that the semiconductor layer 104 is implemented by a-Si:H often applied to, e.g., LCDs. Then, a photocarrier is generated in the the-Si:H layer by light output from a backlight or light source for display, as stated earlier. The photocarrier migrates in regions 110 where electric field control by the gate electrode 102 and drain electrode 106a and source electrode 106b is weak, enhancing a light OFF current. As a result, leak occurs via the pixel electrode 107 and degrades display quality. To reduce the photocarrier, Japanese Patent Laid-Open Publication No. 7-147411 mentioned earlier proposes to locally reduce the area of a low concentration diffusion layer included in a semiconductor device. Specifically, as shown in FIG. 2A, a semiconductor layer 104 connected to a drain electrode 106a or a source electrode 106b by a contact 111 may have its portion outside of a gate electrode 102 reduced in area. Alternatively, as shown in FIG. 2B, a part of the semiconductor layer 104, including a portion just above the gate electrode 102, may be reduced in area. FIG. 3 shows another conventional implementation for reducing the photocarrier and therefore a light OFF current and disclosed in Japanese Patent Laid-Open Publication No. 7-94753 also mentioned earlier. As shown, a gate electrode 102 is provided with a greater area than a semiconductor layer 104 so as to screen the entire semiconductor layer 104.

However, the above conventional technologies each has some problems left unsolved, as discussed earlier.

Figure 4A:
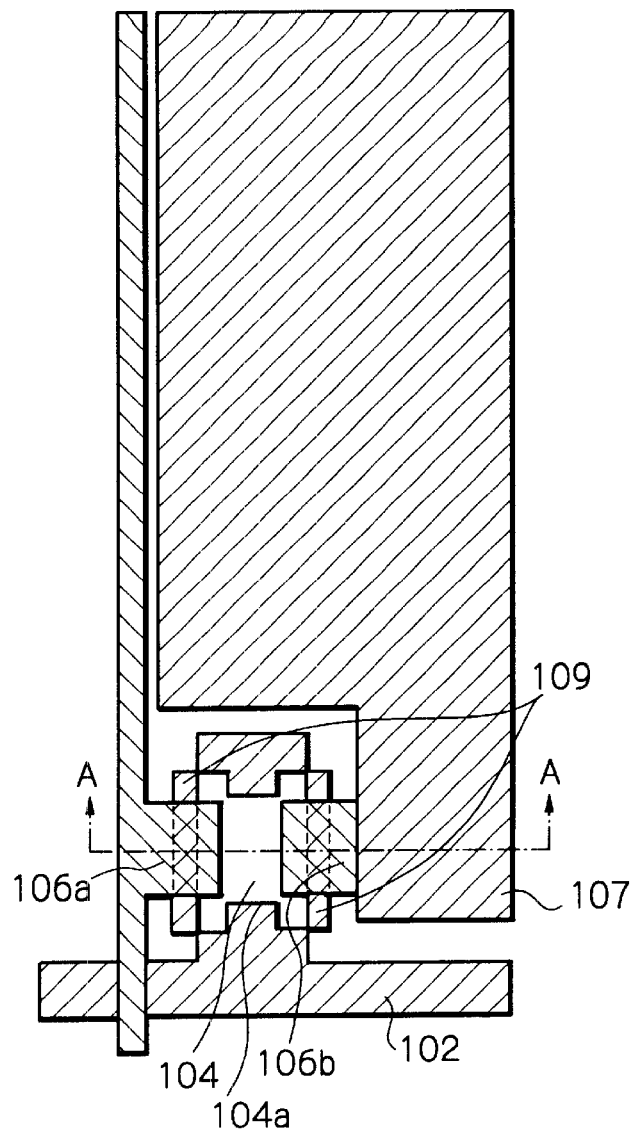
FIG. 4A is a plan view showing a TFT embodying the present invention.
Figure 4B:
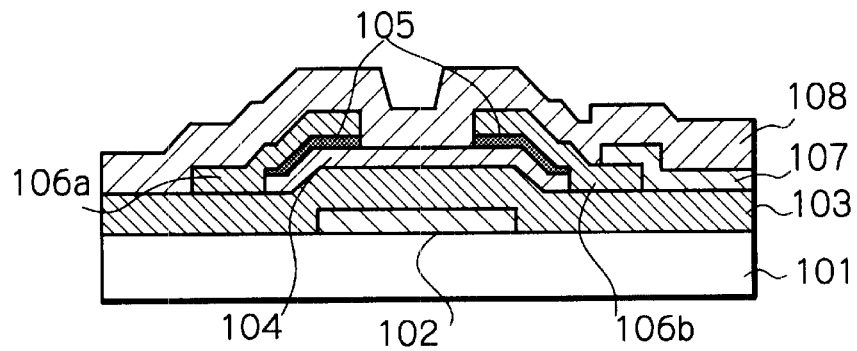
FIG. 4B is a section along line A—A of FIG. 4A.

Referring to FIGS. 4A and 4B, a TFT embodying the present invention is shown and includes a glass substrate 101 constituting a TFT array substrate. A gate electrode 102 is formed on the glass substrate 101 and covered with a first insulation film or gate insulation film 103. A semiconductor layer 104 is formed on the insulation film 103 just above the gate electrode 102. Two n⁺ type semiconductor layers 105 are provided at both sides of the semiconductor layer 104. A drain electrode 106a and a source electrode 106b are respectively formed on the opposite n⁺ type semiconductor layers 105. In the illustrative embodiment, the semiconductor layer 104 has a width greater than the width of each of the drain electrode 106a and source electrode 106b in the direction of channel width, and has a length greater than the length of the gate electrode 102 in the direction of channel length. In addition, a portion of the semiconductor layer 104 between the drain electrode 106a and the source electrode 106b is notched at both side edges in the direction of channel width. The source electrode 106b is formed integrally with a pixel electrode 107. A second insulation film 108 covers the entire TFT laminate.

A specific method available for the fabrication of the above TFT is as follows. A 1,000 Å to 3,000 Å thick film of Cr, Mo, Al, Ta, Ti or similar metal is formed on the glass substrate 101 as the gate electrode 102 by sputtering and then patterned by photolithography. Then, the insulation film 103, semiconductor layer 104 and n⁺ type semiconductor layer 105 are sequentially formed in vacuum by PCVD (Plasma Chemical Vapor Deposition). For the insulation layer 103, use is made of SiNx, SiO₂ or similar compound. The semiconductor layers 104 and n⁺ type semiconductor layer 105 are implemented by a-Si and n⁺-a-Si, respectively. It is preferable that SiNx and SiO₂ implemented as two layers have a total thickness of 1,000 Å 5,000 Å, that the semiconductor layer has a thickness of 1,500 Å to 4,000 Å, and that n⁺-a-Si has a thickness of 500 Å to 1,000 Å.

The above laminate is patterned by selective photolithographic etching such that the opposite side edges 104 of the semiconductor layer 104 in the direction of channel width are partly narrowed down in the direction of channel width above the gate electrode 102. Then, a 1,000 Å to 3,000 Å thick film of Cr, Mo, Al, Ta, Ti or similar metal is formed by sputtering and then patterned to form the drain electrode 106a and source electrode 106b. Subsequently, a 200 Å to 800 Å thick film of ITO or similar transparent conductive material is formed by sputtering and then patterned to form the pixel electrode 107. Thereafter, the n⁺ type semiconductor layer 105 above a channel portion is etched out. Finally, a 1,000 Å to 4,000 Å thick film of, SiNx, SiO₂ or similar compound is formed and then patterned to form the second insulation film 108.

In the TFT fabricated by the above specific procedure, the semiconductor layer 104 has the previously stated dimensions in the direction of channel width and the direction of channel length. The semiconductor layer 104 therefore includes photocarrier generating regions 109 adjoining the drain electrode 106a and source electrode 106b and not shielded by the gate electrode 102. With such photocarrier generating regions 109, it is possible to reduce contact resistance between the two electrodes 106a and 106b and the semiconductor layer 104 and therefore to enhance an ON current. On the other hand, the semiconductor layer 104 is narrowed down in the direction of channel width above the gate electrode 102. The narrowed portion, labeled 104a, has substantially the same width as each of the drain electrode 106a and source electrode 106b. Consequently, the generation of a photocarrier and therefore a light OFF current is reduced in the narrowed portion 104a.

FIG. 5 shows a relation between a gate voltage and a source-drain current available with illustrative embodiment. As FIG. 5 indicates, the illustrative embodiment reduces the light OFF current. This successfully increases the ratio of an ON current to an OFF current when a high luminance backlight is used.

Figure 6A:
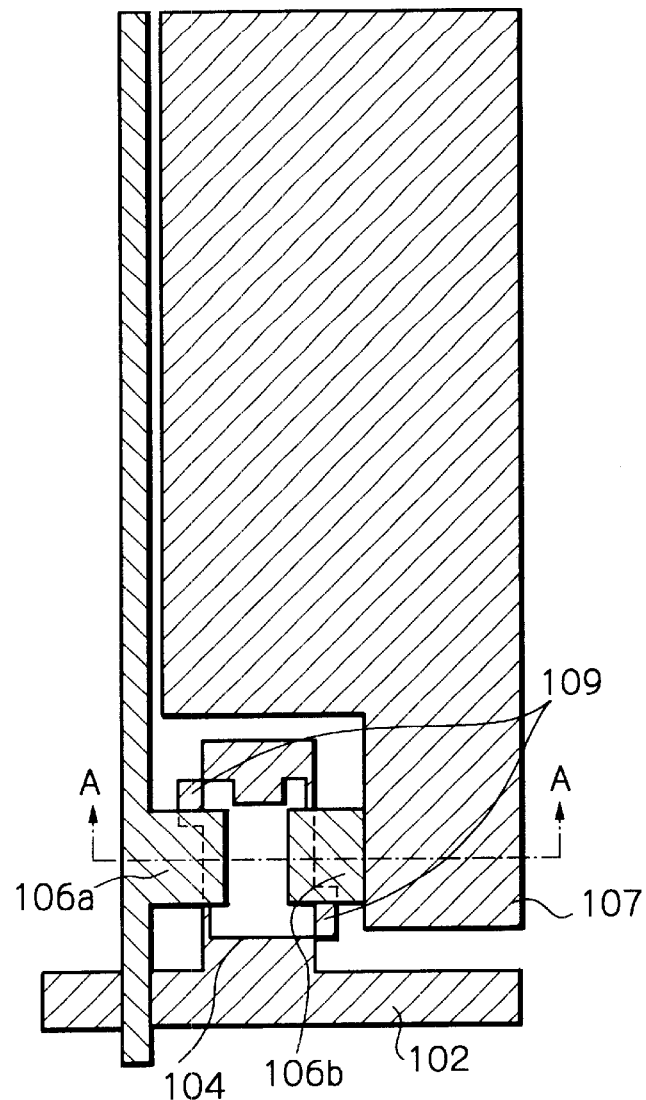
FIG. 6A is a plan view showing an alternative embodiment of the present invention.
Figure 6B:
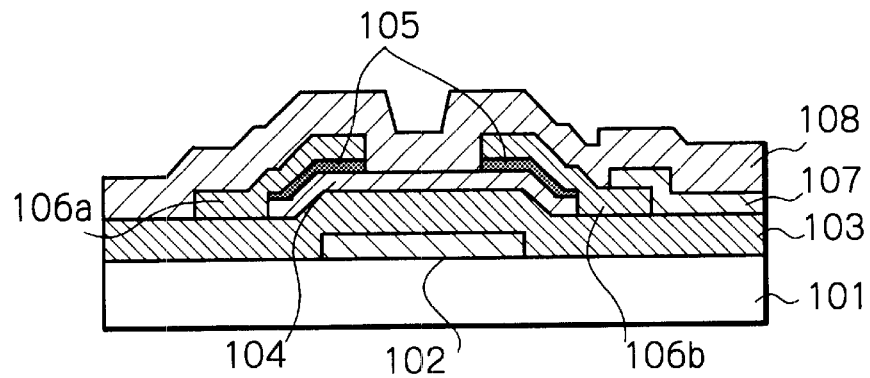
FIG. 6B is a section along line A—A of FIG. 6A.

An alternative embodiment of the present invention is shown in FIGS. 6A and 6B. As shown, this embodiment is characterized in that only two photocarrier generating regions 109 are formed at diagonal positions. In this configuration, a photocarrier generated in the semiconductor layer 104 migrates along a diagonal path in the region where electric field control by the gate electrode 102, drain electrode 106a and source electrode 106b is effective. It follows that this embodiment reduces the light OFF current more than the previous embodiment.

In summary, it will be seen that the present invention provides a TFT capable of reducing a light OFF current. This unprecedented advantage is derived from a unique structure in which a semiconductor layer included in the TFT has its part above a gate electrode in the direction of channel length reduced in dimension in the direction of channel width in order to reduce a photocarrier generating region; in addition, a region where electric field control by a gate electrode, a drain electrode and a source electrode is weak is obviated. Further, photocarrier generating regions formed in the semiconductor layer in the vicinity of the source electrode and drain electrode and not shielded by the gate electrode successfully reduce contact resistance between the drain electrode and the source electrode and therefore prevents a light ON current from being reduced.

Various modifications will become possible for those skilled in the art after receiving the teachings of the present disclosure without departing from the scope thereof.

What is claimed is:

1. In a TFT for an LCD and having a gate electrode, a gate insulation film, an island-like semiconductor layer, a drain electrode and a source electrode sequentially laminated on a transparent insulative substrate, said semiconductor layer has a dimension, in a direction of channel width and in a region between said source and drain electrodes which is smaller than a dimension of said semiconductor layer in said direction of channel width outside said region, wherein said gate electrode extends past all portions of said semiconductor layer in the direction of channel width.

2. A TFT as claimed in claim 1, wherein said first portion of said semiconductor layer is formed by notching opposite side edges of said semiconductor layer in the direction of channel width.

3. A TFT as claimed in claim 2, wherein said semiconductor layer includes a plurality of regions adjoining both said drain electrode and said source electrode and not shielded by said gate electrode.

4. A TFT as claimed in claim 3, wherein said plurality of regions face each other at diagonal positions on said drain electrode and said source electrode.

5. A TFT as claimed in claim 1, wherein said semiconductor layer includes a plurality of regions adjoining both said drain electrode and said source electrode and not shielded by said gate electrode.

6. A TFT as claimed in claim 5, wherein said plurality of regions face each other at diagonal positions on said drain electrode and said source electrode.

7. A TFT as claimed in claim 1, wherein said first portion of said semiconductor layer is formed by notching opposite side edges of said semiconductor layer in the direction of channel width.

8. A TFT as claimed in claim 7, wherein said semiconductor layer includes a plurality of regions adjoining both said drain electrode and said source electrode and not shielded by said gate electrode.

9. A TFT as claimed in claim 8, wherein said plurality of regions face each other at diagonal positions on said drain electrode and said source electrode.

10. A TFT as claimed in claim 1, wherein said semiconductor layer includes a plurality of regions adjoining both said drain electrode and said source electrode and not shielded by said gate electrode.

11. A TFT as claimed in claim 10, wherein said plurality of regions face each other at diagonal positions on said drain electrode and said source electrode.

12. In a TFT for an LCD and having a gate electrode, a gate insulation film, an island-like semiconductor layer, a drain electrode and a source electrode sequentially laminated on a transparent insulative substrate, said semiconductor layer has a dimension, in a direction of channel width and in a region between said source and drain electrodes which is smaller than a dimension of said semiconductor layer in said direction of channel width outside said region, wherein said gate electrode extends past all portions of said semiconductor layer in the direction of channel width and wherein said semiconductor layer has a plurality of portions not shielded by said gate electrode in the vicinity of said drain electrode and said source electrode.

13. A TFT as claimed in claim 12, wherein the dimension of said first portion of said semiconductor layer is substantially equal to or greater than a dimension of each of said drain electrode and said source electrode in the direction of channel width.

14. A TFT as claimed in claim 13, wherein said first portion of said semiconductor layer is formed by notching opposite side edges of said semiconductor layer in the direction of channel width.

15. A TFT as claimed in claim 12, wherein said plurality of regions face each other at diagonal positions on said drain electrode and said source electrode.

16. In a TFT for an LCD and having a gate electrode, a gate insulation film, and island-like semiconductor layer, a drain electrode and a source electrode sequentially laminated on a transparent insulative substrate, said semiconductor layer has a dimension, in a direction of channel width and in a region between said source and drain electrodes which is smaller than a dimension of said semiconductor layer in said direction of channel width outside said region, wherein said gate electrode extends past all portions of said semiconductor layer in the direction of channel width and wherein said semiconductor layer has a plurality of a portions not shielded by said gate electrode in the vicinity of said drain electrode and said source electrode, and wherein said plurality of portions not shielded by said gate electrode are at diagonal positions relative to said drain electrode and said source electrode.

17. A TFT as claimed in claim 16, wherein the dimension of said first portion of said semiconductor layer is substantially equal to or greater than a dimension of each of said drain electrode and said source electrode in the direction of channel width.

18. A TFT as claimed in claim 17, wherein said first portion of said semiconductor layer is formed by notching opposite side edges of said semiconductor layer in the direction of channel width.

* * * * *